US009497894B1

(12) United States Patent
Ramsey

(10) Patent No.: US 9,497,894 B1
(45) Date of Patent: Nov. 15, 2016

(54) LOW IMPEDANCE RADIOFREQUENCY SHIELDED WINDOW

(71) Applicant: John Gordon Ramsey, Pittsford, NY (US)

(72) Inventor: John Gordon Ramsey, Pittsford, NY (US)

( * ) Notice: Subject to any disclaimer, the term of this patent is extended or adjusted under 35 U.S.C. 154(b) by 0 days.

(21) Appl. No.: 14/806,110

(22) Filed: Jul. 22, 2015

(51) Int. Cl.
*H05K 9/00* (2006.01)

(52) U.S. Cl.
CPC ............ *H05K 9/009* (2013.01); *H05K 9/0005* (2013.01); *H05K 9/0007* (2013.01); *H05K 9/0088* (2013.01); *H05K 9/0094* (2013.01)

(58) Field of Classification Search
CPC ............... H05K 9/0005; H05K 9/0094; H05K 9/0086; H05K 9/0088
See application file for complete search history.

(56) References Cited

U.S. PATENT DOCUMENTS

| | | | | |
|---|---|---|---|---|
| 3,305,623 A * | 2/1967 | Bakker | ............ | E06B 5/18 174/381 |
| 4,884,171 A | 11/1989 | Maserang et al. | | |
| 5,012,041 A * | 4/1991 | Sims | ............ | H05K 9/0005 174/381 |
| 5,059,458 A * | 10/1991 | Goodall | ............ | C03C 17/36 428/212 |
| 5,097,885 A * | 3/1992 | Kitagawa | ............ | E06B 5/18 160/238 |
| 5,136,119 A | 8/1992 | Leyland | | |
| 5,139,850 A * | 8/1992 | Clarke | ............ | C03C 17/36 174/389 |
| 5,171,936 A | 12/1992 | Suzuki et al. | | |
| 5,373,102 A * | 12/1994 | Ehrlich | ............ | H05K 9/0094 174/381 |
| 5,594,200 A | 1/1997 | Ramsey | | |
| 6,495,752 B1 * | 12/2002 | Sugizaki | ............ | B32B 27/06 174/389 |
| 8,071,892 B2 * | 12/2011 | Leegate | ............ | H05K 9/0018 174/380 |
| 8,294,044 B2 | 10/2012 | Ramsey | | |
| 8,859,913 B2 * | 10/2014 | Judy | ............ | H05K 9/0043 174/378 |
| 2007/0177075 A1 * | 8/2007 | Kimoto | ............ | A61B 1/00048 349/110 |
| 2009/0084599 A1 * | 4/2009 | Severance | ............ | C09D 5/32 174/350 |
| 2010/0304069 A1 * | 12/2010 | Oguri | ............ | B64C 1/1484 428/38 |

* cited by examiner

*Primary Examiner* — Hung V Ngo
(74) *Attorney, Agent, or Firm* — Patent Technologies, LLC; Robert D. Gunderman, Jr.

(57) ABSTRACT

A low impedance radiofrequency shielded window and radiofrequency shielded enclosure that includes the low impedance radiofrequency shielded window is disclosed. Radiofrequency shielded window layers make up the overall window where the layers are configured in parallel such that each window layer has a direct path to ground. By configuring the ground path of the window layers in parallel, overall reactance and hence resistance is reduced, thus increasing shielding effectiveness of the window.

23 Claims, 7 Drawing Sheets

LOW IMPEDANCE RADIOFREQUENCY SHIELDED WINDOW

BACKGROUND OF THE INVENTION

1. Field of the Invention

The present invention relates to radiofrequency shielding, and more particularly, relates to a low impedance radiofrequency shielded window.

2. Description of Related Art

The reception and transmission of electromagnetic signals is important to the proper functioning of many devices. Cellular telephones and email devices, notebook computer wireless modems, Global Positioning System receivers, wireless data devices, and the like, all rely on the use of electromagnetic signals in the radiofrequency spectrum to operate. Similarly, many sensitive electronic devices may be susceptible to electromagnetic signals in general or radiofrequency signals in particular, and must be shielded from such signals when under test. Testing, tuning, and repair of such a device can require that the Device Under Test (DUT) be isolated from ambient electromagnetic radiation. Exposing a receiving device to an unambiguous test signal free from electromagnetic interference, or obtaining a corresponding clean signal from a transmitting device, is often necessary for testing and calibration. Typically, a device to be tested is placed inside an electromagnetic isolation (EMI) chamber, sometimes also known as a Faraday cage, which comprises a continuous shielded enclosure which prevents ingress or egress of electromagnetic radiation. Such a chamber may take the form of an entire room, known in the art as a "screen room" for its continuous screen shielding, wherein an operator testing a device may also be enclosed in the room with the device.

A screen room can be quite expensive and therefore may not be economically feasible for a small business. Likewise, a screen room can be quite large making it unsuitable for many test or operating environments. Smaller shielded enclosures, also known as shielded boxes, capable of housing a Device Under Test but not an operator, are disclosed, for example, in U.S. Pat. No. 4,884,171 to Maserang et al.; U.S. Pat. No. 5,136,119 to Leyland; U.S. Pat. No. 5,171,936 to Suzuki et al.; U.S. Pat. No. 5,594,200 to Ramsey and more recently U.S. Pat. No. 8,294,044 also to Ramsey. The entire disclosures of these patents are incorporated herein by reference.

While some radiofrequency shielded enclosures are made from a screen shielding that allows for some visibility of the device under test, many radiofrequency shielded enclosures are made from a solid material that necessitates the use of a shielded window to allow for viewing of the device under test and its related switches, controls, displays, and user interface.

Shielded windows to permit viewing of the device under test are disclosed, for example, in the '171 patent to Maserang et al. and the '200 patent to Ramsey. The entire disclosures of these patents are incorporated herein by reference. Typically, a metallic screening is placed against a glass or clear plastic window material, the metallic edge of this screening then makes electrical contact to the enclosure, thus ensuring the shielded window is at the same ground potential as the enclosure walls. To increase radiofrequency shielding effectiveness, two or more layers of metallic screening and glass or clear plastic window material are sometimes sandwiched together, with the layers of metallic screening daisy chained together in series before making electrical contact to the enclosure's (grounded) walls. At lower frequencies, the resistance of each layer to ground is very low and not dominant, but at higher radio frequencies, the inductance of the ground path becomes vitally important to effective shielding. Typical inductance of a layer can be 5-10 nanohenries, and at a frequency of 2 Ghz., this equates to 10-20 ohms to ground. In addition, with most woven metallic screen shielding, the contact points of each screening element are subject to oxidation and less than optimal contact, thus greatly reducing the shielding effectiveness of the shielded window across its area.

What is needed is a radiofrequency shielded window with a low impedance path to ground, even at higher frequencies. What is also needed is a radiofrequency shielded window where the screening is not subject to impedance degradation at the contact points. What is further needed is a radiofrequency shielded window that is lower cost and more robust than currently available shielded windows.

It is therefore an object of the present invention to provide a low impedance radiofrequency shielded window.

These and other objects of the present invention are described in the detailed specification, drawings and claims contained herein.

BRIEF SUMMARY OF THE INVENTION

A low impedance radiofrequency shielded window and radiofrequency shielded enclosure that includes the low impedance radiofrequency shielded window is disclosed. The low impedance radiofrequency shielded window comprises a first window layer having a perimeter, a conductive mesh surface and an insulating surface; a first conductive perimeter layer makes ohmic contact with the conductive mesh surface of the first window layer; this conductive perimeter layer extends to enable electrical contact to the enclosure's grounded wall; a second window layer having a perimeter, a conductive mesh surface and an insulating surface; a second conductive perimeter layer makes ohmic contact with the conductive mesh of the second window layer and its conductive perimeter layer also extends to enable electrical contact to the enclosure's grounded wall; thus allowing each window layer a separate path directly to the enclosure's grounded wall. Additional window layers may be added in a similar manner, providing an equivalent circuit of parallel resistors, each with its own exclusive path directly to ground.

The foregoing paragraph has been provided by way of introduction, and is not intended to limit the scope of the invention as described and claimed herein.

BRIEF DESCRIPTION OF THE DRAWINGS

The invention will be described by reference to the following drawings, in which like numerals refer to like elements, and in which.

Figure 1:
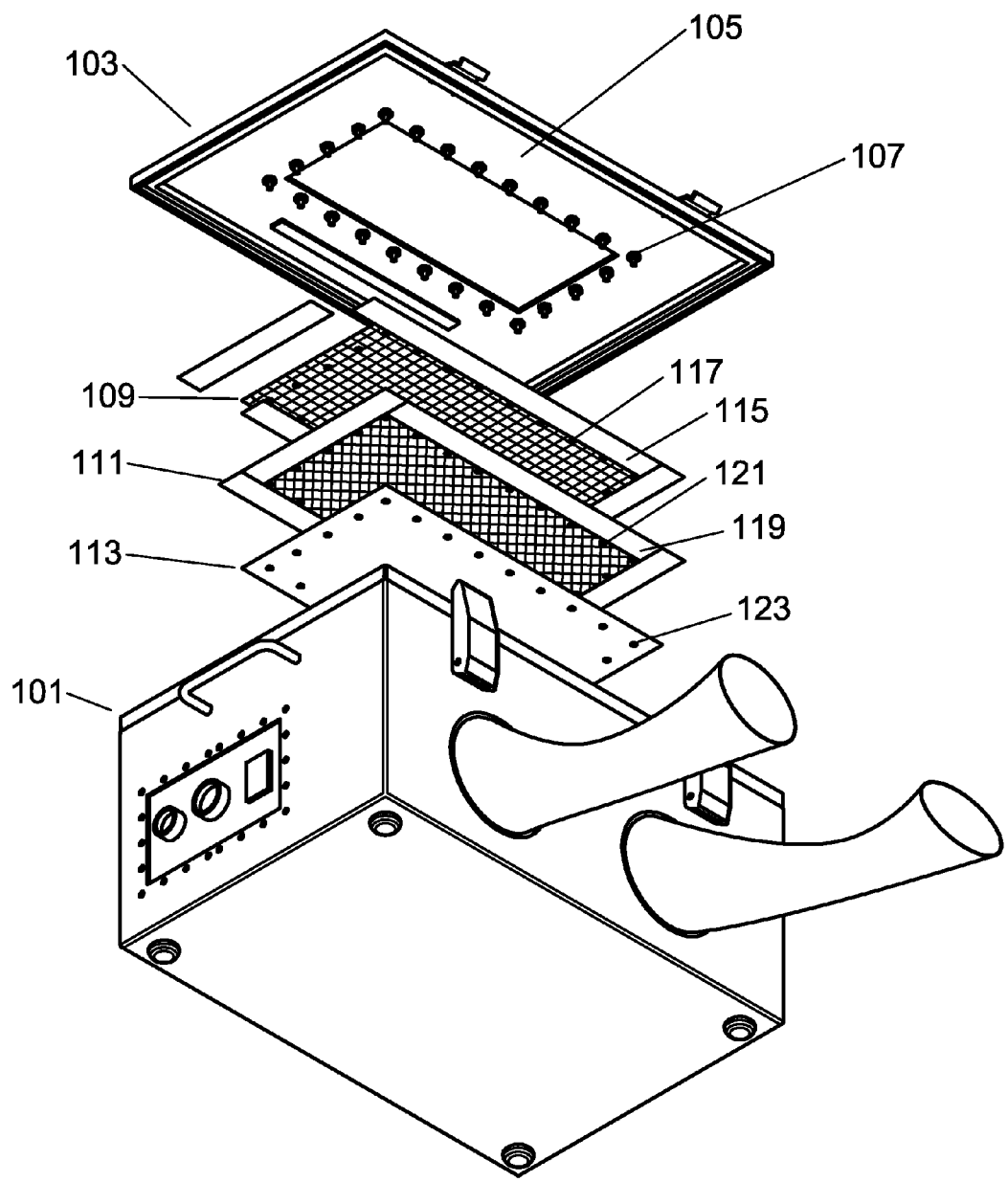
FIG. 1 is an exploded perspective view of an low impedance radiofrequency shielded window used with a shielded enclosure.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification, drawings, and claims contained herein.

DESCRIPTION OF THE PREFERRED EMBODIMENTS

For a general understanding of the present invention, reference is made to the drawings. In the drawings, like reference numerals have been used throughout to designate identical elements.

The low impedance radiofrequency (RF) shielded window is depicted as being installed in an enclosure, however, the radiofrequency shielded window of the present invention may be installed in a variety of enclosures, containers, shelters, buildings, walls, ceilings, cabinets, and the like. While the use of a screen material for radiofrequency shielding in combination with a clear material such as a glass or plastic is known, the specific arrangement of shielded window layers as disclosed herein to achieve low impedance shielding effectiveness has heretofore been unknown.

Specifically, each layer of screen in a typical radiofrequency shielded window only provides 20-40 db of RF shielding, and thus to achieve greater shielding effectiveness these layers are commonly stacked. With each layer isolated from the other, the current from the upper layer passes through the lower layer's path to ground, thus effectively "lifting" the ground of the upper layer from true ground, making the upper layer less effective than it would be without this ground shift effect. Essentially, this problem of decreased shielding effectiveness is akin to resistors in series, where each shielding layer is equivalent to a resistor in series. At higher frequencies, inductance of this ground path can be, for example, 5-10 nanohenries and at 2 Gigahertz this is equivalent to 10-20 ohms; thus the ground of the window shielding layer is diminished by this resistance. Series stacking of shielded windows has diminishing returns as related to shielding effectiveness.

Figure 7:
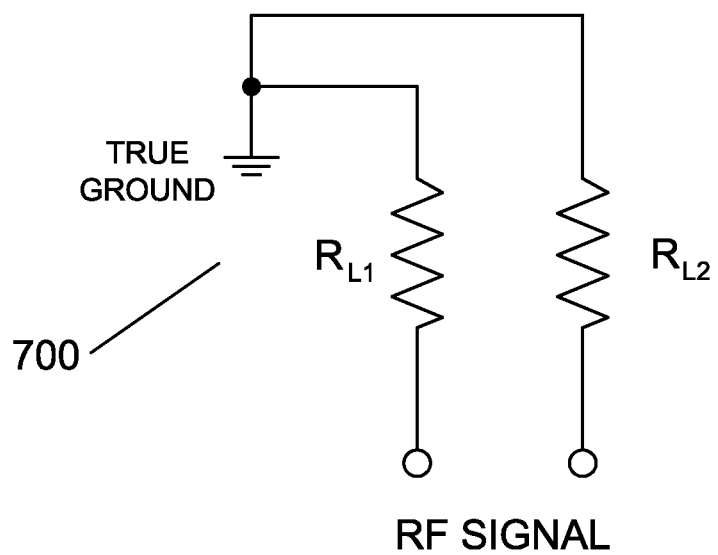
FIG. 7 is an equivalent circuit of the low impedance radiofrequency shielded window.

The present invention, however, overcomes the problem of ground lifting of series stacked radiofrequency shielded windows by essentially placing the ground paths of each radiofrequency shielded window in parallel such that each layer goes to ground independently of the other. FIG. 7 depicts a typical equivalent circuit of a two layer RF shielded window of the present invention. The physical structure and implementation of such a novel arrangement will be described in further detail below.

Turning now to FIG. 1, an exploded perspective view of a low impedance radiofrequency shielded window used with a shielded enclosure is depicted. While two window layers are depicted, in some embodiments of the present invention there may be three or more window layers interconnected in a similar manner to that which will be further described. Each window layer has a conductive mesh surface and an insulating surface. The conductive mesh surface may have a conductive mesh such as copper mesh or screening attached to, bonded or printed to it. In some embodiments of the present invention, the conductive mesh may comprise more of a coating or a film than a true mesh, in such a way that radiofrequency shielding is accomplished. Thus, mesh refers to any radiofrequency shielded coating that maintains optical transparency or visibility regardless of the size of the mesh openings, or lack thereof. On the opposing surface of each window layer, there is no conductive mesh and therefore it is considered an insulating surface. The conductive mesh surface and the insulating surface make up opposing sides to each window layer. In FIG. 1, the first window layer 109 comprises a perimeter, a conductive mesh surface and an insulating surface. A first conductive perimeter layer 115 makes ohmic contact with the conductive mesh surface of the first window layer and extends past the insulating surface of the first window layer 109 to allow contact to ground. The window layers may be made from glass, a plastic such as polycarbonate, or the like.

A second window layer 111 also comprises a perimeter, a conductive mesh surface and an insulating surface. A second conductive perimeter layer 119 makes ohmic contact with the conductive mesh of the second window layer 111 and extends past the insulating surface of the first window layer, where it makes contact to ground independently of the first window layer. The first conductive perimeter layer 115 and the second conductive perimeter layer 119 make mechanical and ohmic contact along the insulating surface of the first window layer 109, thus creating a separate path to ground for each window layer.

In some embodiments of the present invention, the second conductive perimeter layer 119 makes ohmic contact with the conductive mesh of the second window layer ill and extends to the first conductive perimeter layer 115. The first conductive perimeter layer 115 and the second conductive perimeter layer 119 make mechanical and ohmic contact along the perimeter of the first window layer 109. The conductive mesh of each layer therefore goes independently to ground. Each conductive perimeter layer folds over such that each layer contacts the grounding wall of the enclosure at the same or a similar point.

While the conductive mesh may simply be a fine mesh screen attached to or otherwise connected with a glass or plastic pane, in some embodiments of the present invention, the conductive mesh may be screen printed on a polycarbonate film or similar substrate to make up the conductive mesh surface of each window layer. There are disadvantages to the use of wire mesh in radiofrequency shielding including the degradation over time of many of the wire junctions in the wire mesh, creating a high impedance junction and associated shielding degradation. The use of screen printed wire mesh on each window layer solves the problem of ground path and associated shielding degradation. In addition, thin film coatings that may be optically transparent or provide good visual clarity may also be used. An example of such a coating is indium-Tin-Oxide (ITO). Other conductive shielding materials may also be used.

The opposing side of each window layer that does not contain conductive mesh is in turn referred to as the insulating surface. The conductive mesh surface and the insulating surface of each window layer are each a planar surface of their respective window layer. In some embodiments of the present invention, the conductive mesh is embedded or otherwise molded, sandwiched or contained within a window layer, and the terms conductive mesh surface and insulating surface may in fact be somewhat arbitrary, but still serve a useful purpose in defining the fact that each window layer has two opposing surfaces and a conductive layer integrated therein.

In some embodiments of the present invention, more than two window layers may be employed. For example, three or four window layers may provide additional signal attenuation that is necessary for some applications. To further improve on shielding effectiveness, the conductive mesh of each window layer may be overlaid at an angle with the orientation of the conductive mesh of the previous layer. An overlay angle of between 30 and 60 degrees, for example, may be suitable.

A protective layer 113 may also optionally be employed to protect the radiofrequency shielded window layers. The protective layer 113 may be a clear polycarbonate, acrylic, or the like.

The conductive perimeter layers are, in some embodiments of the present invention, a conductive tape such as, for example, a fabric conductive tape such as a silver fabric conductive tape. To make the described window layer assembly using such a conductive tape, the tape is applied half way on to the edge of each window layer with the remaining half left free while other assembly steps are completed. The other window layers are constructed the same way. To complete the assembly, the free edges of the conductive tape are folded over so that each layer's conductive tape connects at the same point, typically where the overall window assembly is fastened to an enclosure wall. Using this novel arrangement, each layer has its own path to ground and one layer does not have to go through another layer to get to ground. When attaching one window layer to another window layer, the first conductive perimeter layer 115 and the second conductive perimeter layer 119 (or additional conductive perimeter layers) are aligned where there are no seams between the conductive perimeter layers (for example, conductive tape). An example of such an arrangement can be seen in FIG. 1 as well as FIGS. 4 and 6. The conductive tape or other conductive perimeter layer are arranged such that the seams of one layer overlap the seams of another layer, ensuring that seams of different layers are not superimposed on each other where they would permit radiofrequency signal leakage.

Various techniques to ensure proper mechanical and electrical connection of each layer may be used. For example, rivets, bolts, screws, clips, adhesives, wire, clamps, or the like, may be used as fasteners. In the example provided herein, fasteners 107 such as bolts may be used. To receive the fasteners 107, mounting holes may be placed around the periphery of each window layer or at other suitable locations. For example, first window layer mounting holes 117 can be seen in FIG. 1 along with second window layer mounting holes 121. Additional window layers would also have similar mounting holes, as well as optional protective layer mounting holes 123.

A radiofrequency shielded enclosure 101 can be seen in FIG. 1. The radiofrequency shielded enclosure depicted is merely an example, and should not be considered a limitation. For example, while conductive sleeves are depicted as part of the radiofrequency shielded enclosure, they may be omitted entirely, modified, or replaced with conductive gloves, mittens, probes, or the like. In the example depicted in FIG. 1, a radiofrequency shielded cover 103 can be seen. The radiofrequency shielded enclosure is made from a conductive material such as a metal, for example, steel or copper. The radiofrequency shielded cover 103 is also made from a conductive material 105 such as a metal, for example, steel or copper. Fasteners 107 can be seen that have been attached to the radiofrequency shielded cover 103 where the opening for the low impedance radiofrequency shielded window can be seen. The radiofrequency shielded enclosure comprises a volume defined by conductive surfaces enclosing said volume to create a faraday cage enclosure. The low impedance radiofrequency shielded window is placed in the opening, and the fasteners 107 pass through the mounting holes in each window layer, and are tightened securely in place, creating a radiofrequency tight seal. Of course the low impedance radiofrequency shielded window can be placed in another location on the enclosure where a sufficient opening has been fabricated.

Figure 2:
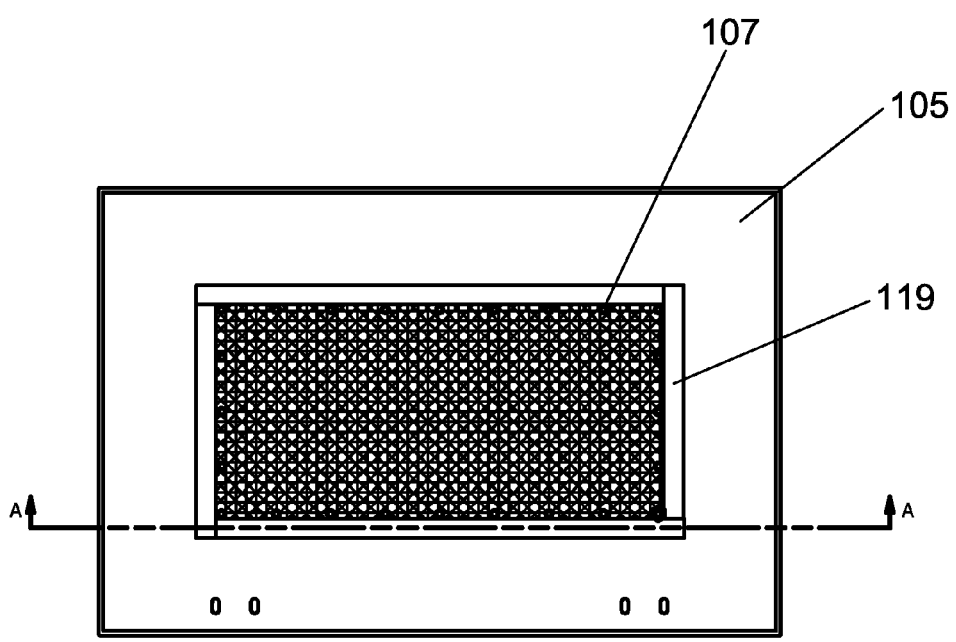
FIG. 2 is a plan view of the low impedance radiofrequency shielded window installed in a cover for a shielded enclosure.

FIG. 2 is a plan view of the low impedance radiofrequency shielded window installed in a cover for a shielded enclosure. The angled overlay of conductive mesh patterns in the window layers can be seen. Also the second conductive perimeter layer 119 can be seen as well as fasteners around the perimeter of the window assembly.

Figure 3:
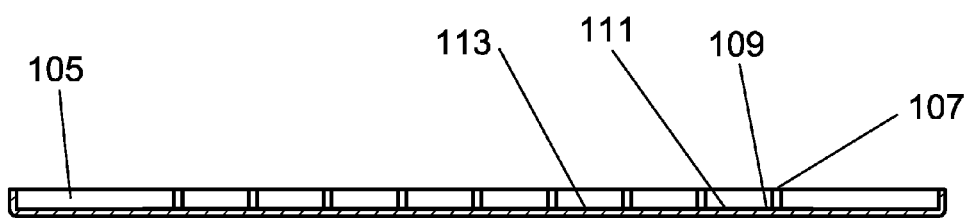
FIG. 3 is a cross sectional view of the low impedance radiofrequency shielded window taken along line A-A of FIG. 2.

Taking a cross section along line A-A of FIG. 2, FIG. 3 depicts the resulting cross sectional view of the low impedance radiofrequency shielded window. The conductive material 105 from a cover, panel or wall of a radiofrequency shielded enclosure can be seen along with the first window layer 109 and the second window layer 111, covered by a protective layer 113.

Figure 4:
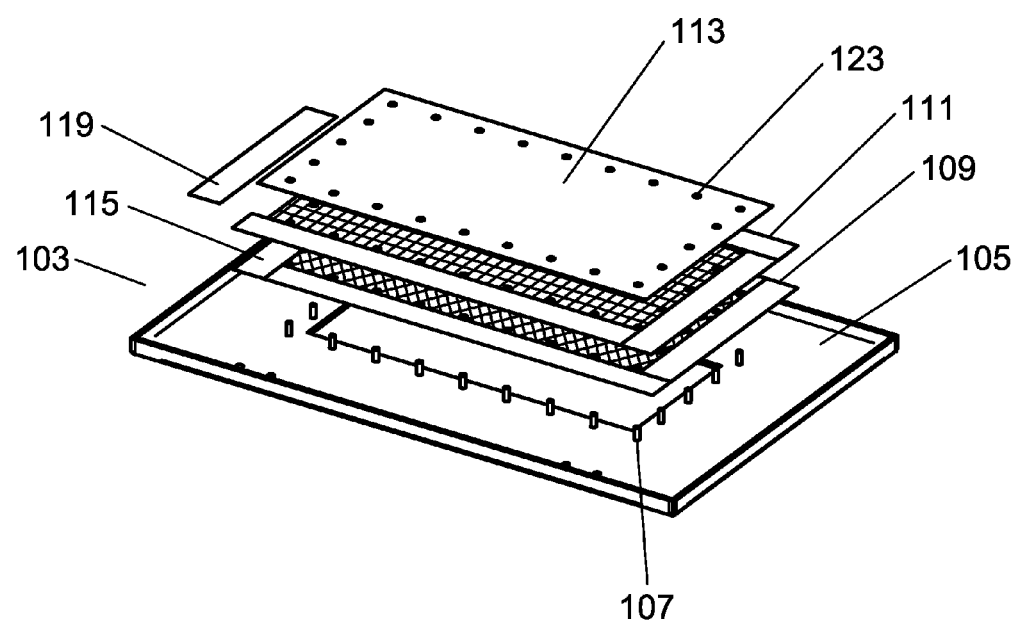
FIG. 4 is an exploded view of the low impedance radiofrequency shielded window installed in a cover for a shielded enclosure.
Figure 5:
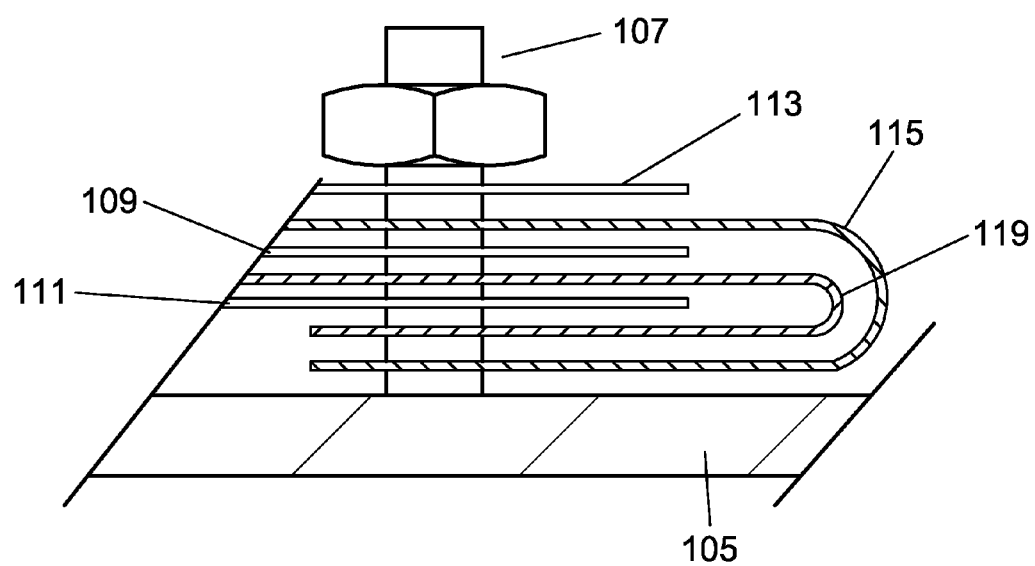
FIG. 5 is a close up diagrammatic view of the layers of the low impedance radiofrequency shielded window, each having an exclusive, independent path to ground.

FIG. 4 depicts an exploded view of the low impedance radiofrequency shielded window installed in a cover for a shielded enclosure. The skewed or staggered seams of the conductive perimeter layers can be seen along with the overlay of the conductive mesh of the window layers. It should be noted that there may be more than two window layers in some embodiments of the present invention that are interconnected with parallel ground paths as described herein. It should be noted that each layer terminates independently to ground. For example, the conductive perimeter layers are wrapped in such a way that they each have an independent path to ground (in this case the shielded enclosure) as seen in FIG. 5. The layers are not merely stacked, as this would result in each previous layer being in the path to ground for the subsequent layers.

FIG. 5 is a close up diagrammatic view of the layers of the low impedance radiofrequency shielded window. The way in which the first conductive perimeter layer 115 and the second conductive perimeter layer 119 make contact with the window layers and each layer then contacts ground independently can be clearly seen. Additional window layers may be interconnected in the same manner as depicted in FIG. 5. A typical fastener 107 is also shown that pulls the layers together and holds them in place against conductive material 105 of a radiofrequency enclosure.

Figure 6:
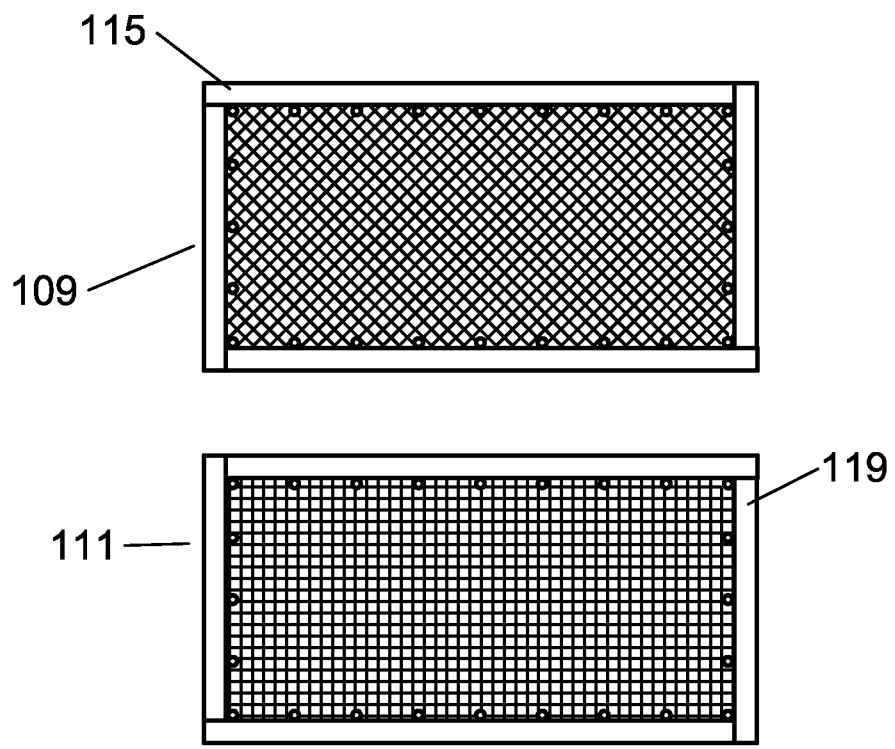
FIG. 6 depicts two exemplary layers of the low impedance radiofrequency shielded window.

FIG. 6 depicts two exemplary layers of the low impedance radiofrequency shielded window showing the angled orientation of the conductive mesh between layers as well as the staggered seams of the conductive perimeter layers.

Lastly, to further depict schematically the independent path to ground for each window layer of the low impedance radiofrequency shielded window of the present invention, FIG. 7 is an equivalent circuit of the low impedance radiofrequency shielded window having two window layers. RL1 and RL2 represent a first radiofrequency shielded window layer and a second radiofrequency shielded window layer respectively. Merely stacking each window layer would result in a series equivalent circuit that would not have the independent ground path and improved shielding of the present invention.

The low impedance radiofrequency shielded window can be installed in a radiofrequency shielded enclosure to provide visibility while still affording radiofrequency shielding. Radiofrequency shielded enclosures have many uses, from testing to secure communications and military and police work.

It is, therefore, apparent that there has been provided, in accordance with the various objects of the present invention, an low impedance radiofrequency shielded window. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, drawings and claims herein.

What is claimed is:

1. A low impedance radiofrequency shielded window for electromagnetic isolation comprising:
    a first window layer comprising a perimeter, a conductive mesh surface and an insulating surface;
    a first conductive perimeter layer making ohmic contact with the conductive mesh surface of the first window layer and extending past the insulating surface of the first window layer to allow contact to ground;
    a second window layer comprising a perimeter, a conductive mesh surface and an insulating surface;
    a second conductive perimeter layer making ohmic contact with the conductive mesh of the second window layer and extending past the insulating surface of the first window layer, where it makes contact to ground independently of the first window layer;
    the first conductive perimeter layer and the second conductive perimeter layer making mechanical and ohmic contact along the insulating surface of the first window layer thus allowing each window layer a separate path directly to ground.

2. The low impedance radiofrequency shielded window of claim 1, further comprising a third window layer.

3. The low impedance radiofrequency shielded window of claim 2, wherein the third window layer is a protective layer.

4. The low impedance radiofrequency shielded window of claim 2, wherein the third window layer comprises a conductive mesh surface and an insulating surface.

5. The low impedance radiofrequency shielded window of claim 2, further comprising a fourth window layer.

6. The low impedance radiofrequency shielded window of claim 1, wherein the first window layer and the second window layer comprise a polycarbonate film having a screen printed metal mesh pattern deposited thereon.

7. The low impedance radiofrequency shielded window of claim 6, wherein the screen printed metal mesh pattern comprises copper.

8. The low impedance radiofrequency shielded window of claim 1, wherein the conductive mesh of the first window layer and the conductive mesh of the second window layer overlay at an angle of between 30 degrees and 60 degrees.

9. The low impedance radiofrequency shielded window of claim 1, wherein the first conductive perimeter layer and the second conductive perimeter layer are a conductive tape.

10. The low impedance radiofrequency shielded window of claim 1, wherein the first conductive layer and the second conductive layer are a silver fabric conductive tape.

11. The low impedance radiofrequency shielded window of claim 1, wherein the first conductive perimeter layer and the second conductive perimeter layer are aligned where there are no seams between the first conductive perimeter layer and the second conductive perimeter layer that align.

12. A low impedance radiofrequency shielded window for electromagnetic isolation comprising:
    a first window layer comprising a perimeter, a conductive mesh surface and an insulating surface;
    a first conductive perimeter layer making ohmic contact with the conductive mesh surface of the first window layer;
    a second window layer comprising a perimeter, a conductive mesh surface and an insulating surface;
    a second conductive perimeter layer making ohmic contact with the conductive mesh of the second window layer and extending to the first conductive perimeter layer;
    the first conductive perimeter layer and the second conductive perimeter layer making mechanical and ohmic contact along the perimeter of the first window layer thus allowing each window layer a separate path directly to ground.

13. The low impedance radiofrequency shielded window of claim 12, further comprising a third window layer.

14. The low impedance radiofrequency shielded window of claim 12, wherein the third window layer is a protective layer.

15. The low impedance radiofrequency shielded window of claim 12, wherein the third window layer comprises a conductive mesh surface and an insulating surface.

16. The low impedance radiofrequency shielded window of claim 12, further comprising a fourth window layer.

17. The low impedance radiofrequency shielded window of claim 12, wherein the first window layer and the second window layer comprise a polycarbonate film having a screen printed metal mesh pattern deposited thereon.

18. The low impedance radiofrequency shielded window of claim 17, wherein the screen printed metal mesh pattern comprises copper.

19. The low impedance radiofrequency shielded window of claim 12, wherein the conductive mesh of the first window layer and the conductive mesh of the second window layer overlay at an angle of between 30 degrees and 60 degrees.

20. The low impedance radiofrequency shielded window of claim 12, wherein the first conductive perimeter layer and the second conductive perimeter layer are a conductive tape.

21. The low impedance radiofrequency shielded window of claim 12, wherein the first conductive layer and the second conductive layer are a silver fabric conductive tape.

22. The low impedance radiofrequency shielded window of claim 12, wherein the first conductive perimeter layer and the second conductive perimeter layer are aligned where there are no seams between the first conductive perimeter layer and the second conductive perimeter layer that align.

23. A low impedance radiofrequency shielded enclosure for electromagnetic isolation comprising:
    a volume defined by conductive surfaces enclosing said volume to create a faraday cage enclosure;
    a radiofrequency shielded window placed in an opening in the faraday cage enclosure;
    the radiofrequency shielded window comprising a first window layer comprising a perimeter, a conductive mesh surface and an insulating surface;
    a first conductive perimeter layer making ohmic contact with the conductive mesh surface of the first window layer and also with the conductive surface of the faraday cage enclosure;
    a second window layer comprising a perimeter, a conductive mesh surface and an insulating surface;

a second conductive perimeter layer making ohmic contact with the conductive mesh of the second window layer and extending to the first conductive perimeter layer where it also makes ohmic contact with the conductive surface of the faraday cage enclosure.

* * * * *